(12) United States Patent
Zhao et al.

(10) Patent No.: US 9,439,302 B2
(45) Date of Patent: Sep. 6, 2016

(54) TRANSPARENT CONDUCTIVE FILM

(71) Applicants: NANCHANG O-FILM TECH CO., LTD., Nanchang (CN); SUZHOU O-FILM TECH CO., LTD., Suzhou (CN); SHENZHEN O-FILM TECH CO., LTD., Shenzhen (CN)

(72) Inventors: Yunhua Zhao, Shenzhen (CN); Yulong Gao, Shenzhen (CN); Yunliang Yang, Shenzhen (CN); Ying Gu, Shenzhen (CN)

(73) Assignees: NANCHANG O-FILM TECH CO., LTD., Nanchang (CN); SUZHOU O-FILM TECH CO., LTD., Suzhou (CN); SHENZHEN O-FILM TECH CO., LTD., Shenzhen (CN)

( * ) Notice: Subject to any disclaimer, the term of this patent is extended or adjusted under 35 U.S.C. 154(b) by 441 days.

(21) Appl. No.: 13/975,276

(22) Filed: Aug. 23, 2013

(65) Prior Publication Data

US 2014/0353009 A1    Dec. 4, 2014

Related U.S. Application Data

(63) Continuation of application No. PCT/CN2013/079203, filed on Jul. 11, 2013.

(30) Foreign Application Priority Data

May 30, 2013    (CN) .......................... 2013 1 0210468

(51) Int. Cl.
*G06F 3/045*    (2006.01)
*H05K 3/36*    (2006.01)
(Continued)

(52) U.S. Cl.
CPC .............. *H05K 3/361* (2013.01); *G06F 3/044* (2013.01); *G06F 2203/04103* (2013.01);
(Continued)

(58) Field of Classification Search
CPC ........ H05K 3/361; G06F 3/044; G06F 3/045
USPC ........................................... 345/173; 174/255
See application file for complete search history.

(56) References Cited

U.S. PATENT DOCUMENTS 8,754,662 B1 * 6/2014 Weng ................. G01R 27/2605
324/686
2012/0251800 A1 * 10/2012 Nakayama .............. G06F 3/044
428/210
(Continued)

FOREIGN PATENT DOCUMENTS

CN         102063951 A    5/2011
CN         102222538 A    10/2011
(Continued)

OTHER PUBLICATIONS

Korean Examination Report of corresponding Republic of Korea patent Application No. 10-2013-7025590, dated Jan. 29, 2015.
Taiwan Examination Report and Search Report of corresponding Taiwan patent Application No. 102130454, dated Mar. 5, 2015.
Chinese International Search Report of corresponding International PCT Application No. PCT/CN2013/079203 dated Mar. 6, 2014.

*Primary Examiner* — Towfiq Elahi
(74) *Attorney, Agent, or Firm* — Hodgson Russ LLP (57) ABSTRACT

A transparent conductive film, includes: a transparent substrate, wherein a transparent substrate includes a body and a flexible board, a width of flexible board is less than that of the body, and the body includes a sensing area and a border area located at an edge of the sensing area; a conduction line, disposed on a transparent flexible substrate; a first conductive layer and a second conductive layer, disposed on two sides of the sensing area opposite to each other; a first electrode trace and a second electrode trace, disposed on the border area, and the first conductive layer and the conduction line are electrically connected through a first electrode trace; the second conductive layer and the conduction line are electrically connected through a second electrode trace. The production efficiency of the above transparent conductive film is improved.

14 Claims, 4 Drawing Sheets

(51) Int. Cl.
 *H05K 1/02* (2006.01)
 *H05K 1/03* (2006.01)
 *H05K 3/10* (2006.01)
 *H05K 3/12* (2006.01)
 *G06F 3/044* (2006.01)

(52) U.S. Cl.
 CPC ........... *H05K 1/0228* (2013.01); *H05K 1/036* (2013.01); *H05K 1/0393* (2013.01); *H05K 3/107* (2013.01); *H05K 3/1258* (2013.01); *H05K 2201/0108* (2013.01); *H05K 2201/0129* (2013.01); *H05K 2201/053* (2013.01); *H05K 2201/09036* (2013.01); *H05K 2201/09681* (2013.01); *H05K 2201/09827* (2013.01); *H05K 2203/1572* (2013.01)

(56) References Cited

U.S. PATENT DOCUMENTS

| | | | |
|---|---|---|---|
| 2013/0082964 A1 | 4/2013 | Agari et al. | 345/173 |
| 2013/0127770 A1 | 5/2013 | Trend | 345/174 |
| 2014/0176819 A1* | 6/2014 | Yilmaz | G06F 1/1692 |
| | | | 349/12 |

FOREIGN PATENT DOCUMENTS

| | | |
|---|---|---|
| CN | 102903423 A | 1/2013 |
| JP | 2013-093014 A | 5/2013 |
| KR | 10-2013-0051317 A | 5/2013 |
| TW | 201234247 A1 | 8/2012 |
| TW | 201243682 A1 | 11/2012 |
| TW | 201303905 A1 | 1/2013 |
| TW | M453197 U1 | 5/2013 |

* cited by examiner

TRANSPARENT CONDUCTIVE FILM

CROSS-REFERENCE TO RELATED APPLICATIONS

This application is a continuation of International Patent Application NO. PCT/CN2013/079203, filed on Jul. 11, 2013, which claims priority to Chinese Patent Application No. 201310210468.9, filed on May 30, 2013, both of which are hereby incorporated by reference in their entireties.

TECHNICAL FIELD

The present invention relates to the field of touch screen and, in particular, to a transparent conductive film.

BACKGROUND

A transparent conductive film is a thin film which has good conductivity and high optical transparency within a visible band. Currently, transparent conductive films have been widely used in the fields of flat panel display, photovoltaic device, touch panel, and electromagnetic shielding etc. Transparent conductive films have an extremely broad market potential.

A flexible circuit board, which is made by using polyimide or polyester film as a substrate, is a highly reliable printed circuit board with excellent flexibility. The flexible circuit board, abbreviated as soft board or FPC (Flexible Printed Circuit), is characterized by high wiring density, light weight and thin thickness. The transparent conductive film is connected to an external circuit through the FPC, so that a position signal sensed by the transparent conductive film can be transferred to a processor and identified, so as to determine the touch location.

Traditionally, when connecting a transparent conductive film to an external circuit through an FPC, the FPC is applied to a lead area of the transparent conductive film firstly, and then the FPC is connected to a printed circuit board (Printed Circuit Board, PCB), which results in low production efficiency.

SUMMARY

Based on this, it is necessary to provide a transparent conductive film which can be produced with high production efficiency.

A transparent conductive film, includes:

a transparent substrate, where the transparent substrate includes a body and a flexible board formed by extending from a side of the body, a width of the flexible board is less than a width of the body, and the body includes a sensing area and a border area located at an edge of the sensing area;

a conduction line, disposed on the transparent flexible substrate;

a grid-shaped first conductive layer, disposed on a side of the sensing area, where the first conductive layer includes first conductive wires intercrossing each other;

a grid-shaped second conductive layer, disposed on a side of the sensing area opposite to the first conductive layer, where the second conductive layer includes second conductive wires intercrossing each other;

a first electrode trace, disposed on a side of the border area, where the first conductive layer and the conduction line are electrically connected via the first electrode trace; and a second electrode trace, disposed on another side of the border area, where the second conductive layer and the conduction line are electrically connected via the second electrode trace.

In an embodiment of the present invention, on two opposite surfaces of the sensing area, a first groove and a second groove are disposed, respectively, and the first conductive layer is accommodated in the first groove and the second conductive layer is accommodated in the second groove.

In an embodiment of the present invention, a bottom of the first groove is of a non-planar structure, and a bottom of the second groove is of a non-planar structure.

In an embodiment of the present invention, a width of the first groove is 0.2 μm~5 μm, a height of the first groove is 2 μm~6 μm, and a height to width ratio is greater than 1;

a width of the second groove is 0.2 μm~5 μm, a height of the second groove is 2 μm~6 μm, and a height to width ratio is greater than 1.

In an embodiment of the present invention, the first electrode trace and the second electrode trace are embedded in two opposite surfaces of the border area, respectively; or the first electrode trace or the second electrode trace are directly disposed on two opposite surfaces of the border area.

In an embodiment of the present invention, further includes a first matrix layer, and a first groove is disposed on a surface, which is away from the transparent substrate, of a first matrix layer corresponding to the sensing area, wherein the first conductive layer is accommodated in the first groove.

In an embodiment of the present invention, the first electrode trace is embedded in a surface, which is away from the transparent substrate, of a first matrix layer corresponding to the border area; or the first electrode trace is directly disposed on the surface, which is away from the transparent substrate, of the first matrix layer corresponding to the border area.

In an embodiment of the present invention, further includes a second matrix layer, and a second groove is disposed on a surface, which is away from the transparent substrate, of a second matrix layer corresponding to the sensing area, wherein the second conductive layer is accommodated in the second groove.

In an embodiment of the present invention, the second electrode trace is embedded in a surface, which is away from the transparent substrate, of a second matrix layer corresponding to the border area; or the second electrode trace is directly disposed on the surface, which is away from the transparent substrate, of the second matrix layer corresponding to the border area.

In an embodiment of the present invention, a material of the transparent substrate is a thermoplastic material, the thermoplastic material is polycarbonate or polymethyl methacrylate;

a material of the first matrix layer is UV adhesive, embossed plastic or polycarbonate;

a material of the second matrix layer is UV adhesive, embossed plastic or polycarbonate.

In an embodiment of the present invention, the first electrode trace is grid-shaped or strip-shaped, the grid-shaped first electrode trace includes the first conductive leads intercrossing each other, the strip-shaped first electrode trace has a minimal width of 10 μm~200 μm, and a height of 5 μm~20 μm;

the second electrode trace is grid shaped or strip-shaped, the grid-shaped second electrode trace comprises the second conductive leads intercrossing each other, the strip-shaped second electrode trace has a minimal width of 10 µm~200 µm, and a height of 5 µm~20 µm.

In an embodiment of the present invention, the conduction line is grid-shaped or strip-shaped, where the grid-shaped conduction line is formed by intercrossing conduction wires.

In an embodiment of the present invention, a material of the first conductive layer is a conductive metal, where the conductive metal is silver or copper;

a material of the second conductive layer is a conductive metal, where the conductive metal is silver or copper.

In an embodiment of the present invention, further includes a transparent protective layer, where the transparent protective layercovers at least with a part of the transparent substrate, the first conductive layer, the second conductive layer, the first electrode trace, the second electrode trace and the conduction line.

In an embodiment of the present invention, a visible light transmittance of the transparent conductive film is not less than 86%.

According to embodiments of the present invention, the transparent substrate of the transparent conductive film includes a body and a flexible board, the first conductive layer, the second conductive layer, and the conduction line are disposed on a same transparent substrate so as to form a conductive film and a flexible circuit board. Therefore, comparing with the conventional method that needs to adhere a conductive film and a flexible circuit board by an adhering process, the production efficiency of the transparent conductive film according to embodiments of the present invention can be improved since an adhering process is not needed.

DESCRIPTION OF EMBODIMENTS

In order to make the objectives, characteristics and advantages of the present invention more clear and understandable, the following comprehensively describes technical solutions in embodiments of the present invention with reference to the accompanying drawings. In the following, details of embodiments are described for facilitating comprehensive understanding of the present invention. However, the present invention can be implemented in many ways other than those embodiments described therein. Persons skilled in the art can make similar improvements without departing from the principle of the present invention. Therefore, the present invention is not limited to the following disclosed embodiments.

Figure 1:
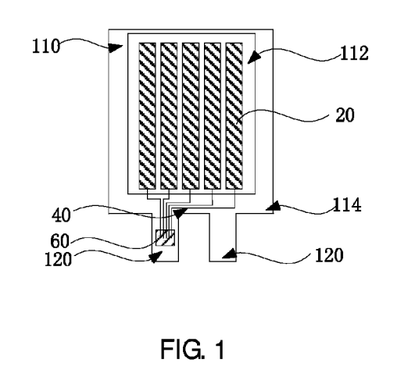
FIG. 1 is a schematic diagram of a cross-sectional structure of a transparent conductive film along a first conductive layer according to an embodiment of the present invention.
Figure 2:
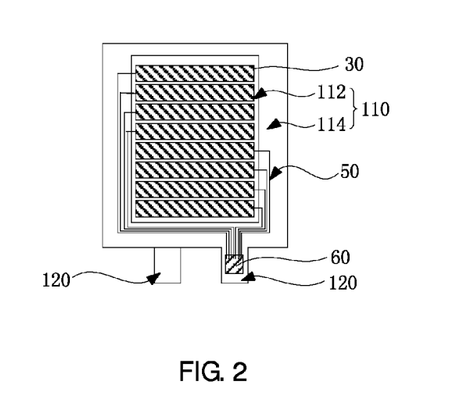
FIG. 2 is a schematic diagram of a cross-sectional structure of a transparent conductive film along a second conductive layer according to an embodiment of the present invention.
Figure 3:
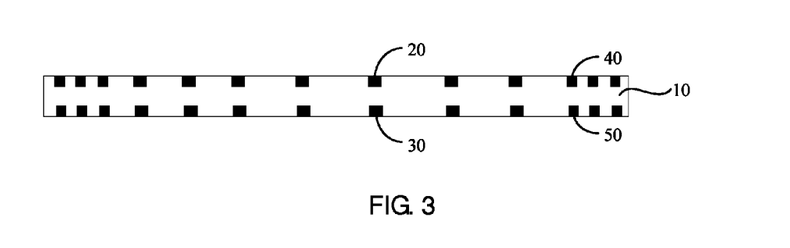
FIG. 3 is a schematic diagram of a cross-sectional structure of a transparent conductive film according to an embodiment of the present invention.

With reference to FIG. 1~FIG. 3, a transparent conductive film 100 according to an embodiment of the present invention includes a transparent substrate 10, a first conductive layer 20, a second conductive layer 30, a first electrode trace 40, a second electrode trace 50, and a conduction line 60.

The material of the transparent substrate may be polyethylene terephthalate (Polyethylene terephthalate, PET) or thermoplastic material. The thermoplastic material may be polycarbonate (Polycarbonate, PC) or polymethylmethacrylate (Polymethylmethacrylate, PMMA).

The transparent substrate includes a body 110 and a flexible board 120 formed by extending from a side of the body 110. The width of the flexible board 120 is less than that of the body 110, and the body 110 includes a sensing area 112 and a border area 114 located at the edge of the sensing area.

On two opposite surfaces of the sensing area 112, a first groove and a second groove are disposed, respectively. On two opposite surfaces of the border area 114, a third groove and a fourth groove are disposed, respectively. The first groove and the third groove are disposed on the same side, and the second groove and the fourth groove are disposed on the same side.

There is at least one flexible board 120. When one flexible board 120 is provided, a fifth groove is disposed on the flexible board 120. The fifth groove may be disposed on the same side with the first groove, and may also be disposed on the same side with the second groove. Certainly, when one flexible board 120 is provided, on two opposite surfaces of the flexible board 120, a fifth groove and a sixth groove may also be disposed, respectively. One of the fifth groove and the sixth groove is disposed on the same side with the first groove, whereas the other is disposed on the same side with the second groove. In this embodiment, two flexible boards 120 are provided. A fifth groove and a sixth groove are disposed on the two flexible boards 120, respectively. One of the fifth groove and the sixth groove is disposed on the same side with the first groove, whereas the other is disposed on the same side with the second groove.

Figure 4:
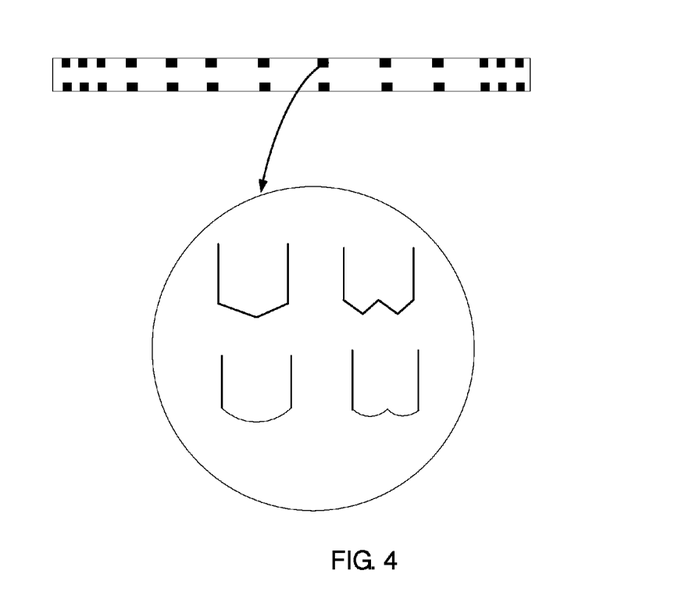
FIG. 4 is a schematic structural diagram of a bottom of a groove according to an embodiment of the present invention.

In convenience of description, the first groove, the second groove, the third groove, the fourth groove, the fifth groove, and the sixth groove are all called groove unless indicated otherwise. With reference to FIG. 4, the bottom of the groove is of a non-planar structure. The bottom of the groove may be "V"-shape, "W"-shape, curved or wavy. The amplitude of the "V"-shape, "W"-shape, curved or wavy bottom of the groove is between 500 nm~1 µm. As the bottom of the groove is set to be "V"-shape, "W"-shape, curved or wavy, the shrinkage of the conductive material can be reduced in the drying and curing process after the conductive material is filled into the groove. Filling the conductive material into the groove and curing the conductive material to form the first conductive wire, the second conductive wire, the first conductive lead, the second conductive lead, and conduction line after curing process, can effectively protect the performance of the conductive material and prevent the breakage of the conductive material caused by shrinkage of the conductive material during the baking process. The width of the groove may be 0.2 µm~5 µm, the height of the groove may be 2 µm~6 µm, and the height to width ratio is greater than 1.

Figure 5:
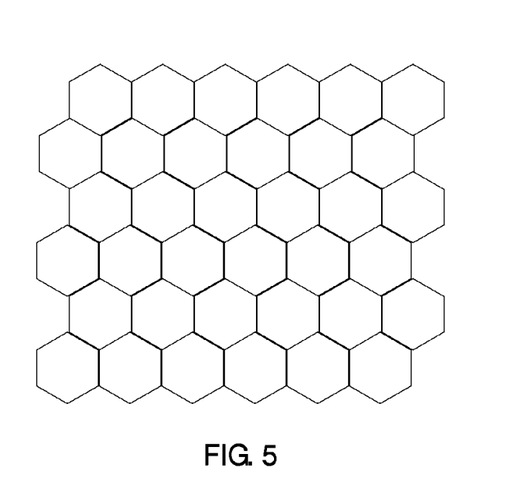
FIG. 5 is a schematic structural diagram of conductive grids according to an embodiment of the present invention.
Figure 6:
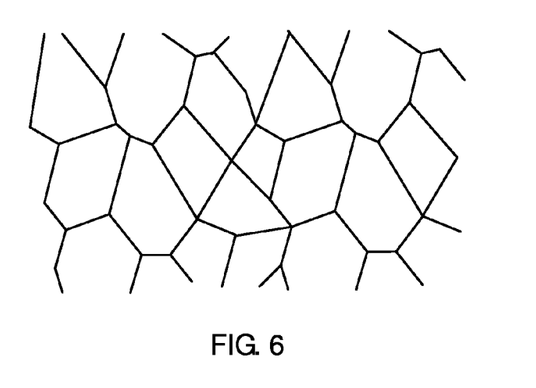
FIG. 6 is a schematic structural diagram of conductive grids according to another embodiment of the present invention.

The first conductive layer 20 is accommodated in the first groove. The first conductive layer 20 is grid-shaped. Referring to FIG. 5~FIG. 6, the grids of the first conductive layer 20 may be regular grids with repeated pattern (FIG. 5) or random grids (FIG. 6). The first conductive layer 20 includes first conductive wires intercrossing each other. The first conductive layer is formed by curing the conductive material filled into the first groove. The material of the first conductive layer may be a conductive metal, where the conductive metal may be silver or copper.

The second conductive layer 30 is accommodated in the second groove. The second conductive layer 30 is grid-shaped. Referring to FIG. 5~FIG. 6, the grids of the second conductive layer 30 may be regular grids with repeated pattern (FIG. 5) or random grids (FIG. 6). The second conductive layer 30 includes second conductive wires intercrossing each other. The second conductive layer is formed by curing the conductive material filled into the second groove. The material of the second conductive layer 30 may be conductive metal, where the conductive metal may be silver or copper.

The first electrode traces 40 and the second electrode traces 50 are accommodated in the third groove and the fourth groove, respectively. The first electrode traces 40 and the first conductive layer 20 are disposed on the same side. The first conductive layer 20 and the conduction line 60 are electrically connected via the first electrode traces 40. The second electrode traces 50 and the second conductive layer 30 are disposed on the same side. The second conductive layer 30 and the conduction line 60 are electrically connected via the second electrode traces 50. The first conductive layer 20 and the conduction line 60 are electrically connected via the first electrode traces 40, and the second conductive layer 30 and the conduction line 60 are electrically connected via the second electrode traces 50, so as to transfer touch signals detected by the sensing area to the conduction line 60.

The first electrode traces 40 may be grid-shaped or strip-shaped. The second electrode traces 50 may also be grid-shaped or strip-shaped.

The grid-shaped first electrode traces 40 include the first conductive leads intercrossing each other. Referring to FIG. 5~FIG. 6, the grids of the first electrode traces 40 may be regular grids with repeated pattern (FIG. 5) or random grids (FIG. 6). The first electrode traces 40 are formed by curing the conductive material filled into the third groove. The material of the first electrode traces 40 may be a conductive metal, where the conductive metal can be silver or copper.

For the strip-shaped first electrode traces 40, the minimal width may be 10 µm~200 µm, and the height may be 5 µm~20 µm.

The grid-shaped second electrode traces 50 include the second conductive leads intercrossing each other. Referring to FIG. 5~FIG. 6, the grids of the second electrode traces 50 may be regular grids with repeated pattern (FIG. 5) or random grids (FIG. 6). The second electrode traces 50 are formed by curing the conductive material filled into the fourth groove. The material of the second electrode traces 50 may be a conductive metal, where the conductive metal may be silver or copper.

For the strip-shaped second electrode traces 50, the minimal width may be 10 µm~200 µm, and the height can be 5 µm~20 µm.

In this embodiment, two conduction lines 60 are provided, and are accommodated in the fifth groove and the sixth groove, respectively. The conduction lines 60 may be grid-shaped or strip-shaped.

The grid-shaped conduction lines 60 include the conduction wires intercrossing each other. Referring to FIG. 5~FIG. 6, the grids of the conduction lines 60 may be regular grids with repeated pattern (FIG. 5) or random grids (FIG. 6). The conduction lines 60 are formed by curing the conductive material filled into the fifth groove and the sixth groove. The material of the conduction lines 60 may be conductive metal, where the conductive metal may be silver or copper.

Figure 7:
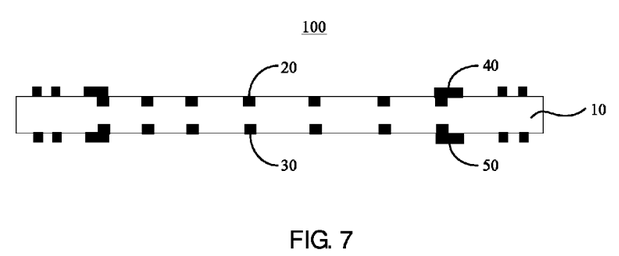
FIG. 7 is a schematic diagram of a cross-sectional structure of a transparent conductive film according to another embodiment of the present invention.

As shown in FIG. 7, the first electrode traces 40 may also be directly disposed on the surface of the border area, and the first electrode traces 40 and the first conductive layer 20 are disposed on the same side. In this case, the first electrode traces 40 are formed by screen printing, lithography or inkjet printing. The second electrode traces 50 may also be directly disposed on the surface of the border area, the second electrode traces 50 and the second conductive layer 30 are disposed on the same side. In this case, the second electrode traces 50 are formed by screen printing, lithography or inkjet printing.

Of course, in other embodiments of the present invention, the first electrode traces 40 and the second electrode traces 50 may also be disposed as follows:

(1) the first electrode traces 40 may be directly disposed on the surface of the border area, and the first electrode traces 40 and the first conductive layer 20 are disposed on the same side. The second electrode traces 50 are accommodated in the fourth groove of the border area, and the second electrode traces 50 and the second conductive layer 30 are disposed on the same side. In this case, the first electrode traces 40 are formed by screen printing, lithography or inkjet printing. The second electrode traces 50 are formed by curing the conductive material filled into the fourth groove.

(2) the first electrode traces 40 are accommodated in the third groove of the border area, and the first electrode traces 40 and the first conductive layer 20 are disposed on the same side. The second electrode traces 50 are directly disposed on the surface of the border area, and the second electrode traces 50 and the second conductive layer 30 are disposed on the same side. In this case, the first electrode traces 40 are formed by curing the conductive material filled into the third groove. The second electrode traces 50 are formed by screen printing, lithography or inkjet printing.

Figure 8:
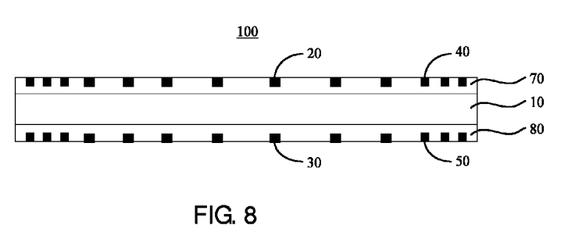
FIG. 8 is a schematic diagram of a cross-sectional structure of a transparent conductive film according to another embodiment of the present invention.

In another embodiment of the present invention as shown in FIG. 8, the transparent conductive film 100 further includes a first matrix layer 70 and a second matrix layer 80. The first matrix layer 70 and the second matrix layer 80 are disposed on two surfaces of the transparent substrate 10 opposite to each other, respectively.

The material of the first matrix layer 70 may be UV adhesive, embossed plastic or polycarbonate.

On the surface, which is away from the transparent substrate 10, of the first matrix layer 70 corresponding to the sensing area 112, a first groove is disposed. On the surface, which is away from the transparent substrate 10, of the first matrix layer 70 corresponding to the border area 114, a third groove is disposed.

The material of the second matrix layer 80 may be UV adhesive, embossed plastic or polycarbonate.

On the surface, which is away from the transparent substrate 10, of the second matrix layer 80 corresponding to the sensing area, a second groove is disposed. On the surface, which is away from the transparent substrate 10, of the second matrix layer 80 corresponding to the border area, a fourth groove is disposed.

In order to facilitate the description, the first groove, the second groove, the third groove, and the fourth groove are all called groove unless indicated otherwise. Referring to FIG. 4, the bottom of the groove may be "V"-shape, "W"-shape, curved or wavy. The amplitude of the "V"-shape, "W"-shape, curved or wavy bottom of the groove is between 500 µm~1 µm. As the bottom of the groove is set to be "V"-shape, "W"-shape, curved or wavy, the shrinkage of the conductive material can be reduced in the drying and curing process after the conductive material is filled into the groove. Filling the conductive material into the groove and curing the conductive material to form the first conductive wire, the second conductive wire, the first conductive lead, and the second conductive lead can effectively protect the performance of the conductive material and prevent the breakage of the conductive material during the baking process. The width of the groove may be 0.2 µm~5 µm, the height of the groove may be 2 µm~6 µm, and the height to width ratio is greater than 1.

The first conductive layer 20 is accommodated in the first groove. The first conductive layer 20 is grid-shaped. Referring to FIG. 5~FIG. 6, the grids of the first conductive layer 20 may be regular grids with repeated pattern (FIG. 5) or random grids (FIG. 6). The first conductive layer 20 includes first conductive wires intercrossing each other. The first conductive layer 20 is formed by curing the conductive material filled into the first groove. The material of the first conductive layer 20 may be a conductive metal, where the conductive metal may be silver or copper.

The first electrode traces 40 are accommodated in the third groove. The first electrode traces 40 may be grid-shaped or strip-shaped.

The grid-shaped first electrode traces 40 include the first conductive leads intercrossing each other. Referring to FIG. 5~FIG. 6, the grids of the first electrode traces 40 may be regular grids with repeated pattern (FIG. 5) or random grids (FIG. 6). The first electrode traces 40 are formed by curing the conductive material filled into the third groove. The material of the first electrode traces 40 may be a conductive metal, where the conductive metal may be silver or copper.

For the strip-shaped first electrode traces 40, the minimal width may be 10 µm~200 µm, and the height may be 5 µm~20 µm.

The second conductive layer 30 is accommodated in the second groove. The second conductive layer 30 is grid-shaped. Referring to FIG. 5~FIG. 6, the grids of the second conductive layer 30 may be regular grids with repeated pattern (FIG. 5) or random grids (FIG. 6). The second conductive layer 30 includes second conductive wires intercrossing each other. The second conductive layer 30 is formed by curing the conductive material filled into the second groove. The material of the second conductive layer 30 may be a conductive metal, where the conductive metal may be silver or copper.

The second electrode traces 50 are accommodated in the fourth groove. The second electrode traces 50 may be grid-shaped or strip-shaped. The grid-shaped second electrode traces 50 include the second conductive leads intercrossing each other. Referring to FIG. 5~FIG. 6, the grids of the second electrode traces 50 may be regular grids with repeated pattern (FIG. 5) or random grids (FIG. 6). The second electrode traces 50 are formed by curing the conductive material filled into the fourth groove. The material of the second electrode traces 50 may be a conductive metal, where the conductive metal may be silver or copper.

For the strip-shaped second electrode traces 50, the minimal width may be 10 µm~200 µm, and the height may be 5 µm~20 µm.

Figure 9:
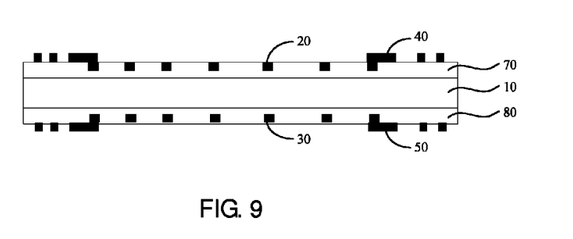
FIG. 9 is a schematic diagram of a cross-sectional structure of a transparent conductive film according to another embodiment of the present invention.

As will be appreciated that, as shown in FIG. 9, the first electrode traces 40 may also be directly disposed on the surface of the first matrix layer 70 corresponding to the border area, and the first electrode traces 40 and the first conductive layer 20 are disposed on the same side. The second electrode traces 50 may also be directly disposed on the surface of the second matrix layer 80 corresponding to the border area, and the second electrode traces 50 and the second conductive layer 30 are disposed on the same side.

In other embodiments, the first electrode traces 40 and the second electrode traces 50 may also be disposed as follows:

(1) the first electrode traces 40 may be directly disposed on the surface of the first matrix layer 70 corresponding to the border area, and the first electrode traces 40 and the first conductive layer 20 are disposed on the same side. The second electrode traces 50 are accommodated in the fourth groove, and the second electrode traces 50 and the second conductive layer 30 are disposed on the same side.

(2) the first electrode traces 40 are accommodated in the third groove, and the first electrode traces 40 and the first conductive layer 20 are disposed on the same side. The second electrode traces 50 are directly disposed on the surface of the second matrix layer 80, and the second electrode traces 50 and the second conductive layer 30 are disposed on the same side.

The transparent conductive film 100 may also include a transparent protective layer (not shown in drawings), and the transparent protective layer covers at least with a part of the transparent substrate 10, the first conductive layer 20, the second conductive layer 30, the first electrode traces 40, the second electrode traces 50 and the conduction line 60. The material of the transparent protective layer may be ultraviolet curable adhesive (UV adhesive), embossed plastic or polycarbonate. The transparent conductive film 100 is provided with a transparent protective layer, which can effectively prevent the oxidation of the conductive material.

The visible light transmittance of the transparent conductive film 100 described above is not less than 86%.

According to embodiments of the present invention, the transparent substrate of the transparent conductive film 100 includes the body 110 and the flexible board 120, the first conductive layer 20, the second conductive layer 30 and the conduction line 60 are disposed on a same transparent substrate so as to form a conductive film and a flexible circuit board. Therefore, comparing with the conventional method that needs to adhere a conductive film and a flexible circuit board by an adhering process, the production efficiency of the transparent conductive film according to embodiments of the present invention can be improved since an adhering process is not needed. The connection between a flexible connecting component and an external device can be realized via adhering or bonding, or via direct plug-in connecting by providing a male or female end at the ends portion of the flexible connecting component. Meanwhile, since the adhering or bonding process is not needed, the production cost can be lowered, and the production yield can be improved. The first conductive layer 20 and the second conductive layer 30 are disposed on two sides of the transparent substrate, respectively, which makes the production more convenient.

It should be noted that the foregoing embodiments merely describe several implementing modes of the present invention with specific details, and should not be interpreted as a limiting the present invention. Persons of ordinary skill in the art may make variants and modifications to the technical solutions described in the foregoing embodiments, without departing from the conception of the present invention, all of these variants and modifications fall within the protection scope of the present invention. Accordingly, the protection scope of the present invention should subject to the appended claims.

What is claimed is:

1. A transparent conductive film, comprising:
a transparent substrate, wherein the transparent substrate comprises a body and a flexible board formed by extending from a side of the body, a width of the flexible board is less than a width of the body, and the body comprises a sensing area and a border area located at an edge of the sensing area;
a conduction line, disposed on the transparent substrate;
a grid-shaped first conductive layer, disposed on a side of the sensing area, wherein the first conductive layer comprises first conductive wires intercrossing each other;
a grid-shaped second conductive layer, disposed on a side of the sensing area opposite to the first conductive layer, wherein the second conductive layer comprises second conductive wires intercrossing each other;
a first electrode trace, disposed on a side of the border area, wherein the first conductive layer and the conduction line are electrically connected via the first electrode trace;
a second electrode trace, disposed on another side of the border area, wherein the second conductive layer and the conduction line are electrically connected via the second electrode trace; and
a first matrix layer, and a first groove is disposed on a surface, which is away from the transparent substrate, of the first matrix layer corresponding to the sensing area, wherein the first conductive layer is accommodated in the first groove.

2. The transparent conductive film according to claim 1, wherein: on two opposite surfaces of the sensing area, the first groove and a second groove are disposed, respectively, and the first conductive layer is accommodated in the first groove and the second conductive layer is accommodated in the second groove.

3. The transparent conductive film according to claim 2, wherein, a bottom of the first groove is of a non-planar structure, and a bottom of the second groove is of a non-planar structure.

4. The transparent conductive film according to claim 2, wherein, a width of the first groove is 0.2 μm~5 μm, a height of the first groove is 2 μm~6 μm, and a height to width ratio is greater than 1; a width of the second groove is 0.2 μm~5 μm, a height of the second groove is 2 μm~6 μm, and a height to width ratio is greater than 1.

5. The transparent conductive film according to claim 1, wherein, the first electrode trace and the second electrode trace are embedded in two opposite surfaces of the border area, respectively; or
the first electrode trace or the second electrode trace is directly disposed on two opposite surfaces of the border area.

6. The transparent conductive film according to claim 1, wherein, the first electrode trace is embedded in a surface, which is away from the transparent substrate, of a first matrix layer corresponding to the border area; or
the first electrode trace is directly disposed on the surface, which is away from the transparent substrate, of the first matrix layer corresponding to the border area.

7. The transparent conductive film according to claim 1, further comprising a second matrix layer, wherein a second groove is disposed on a surface, which is away from the transparent substrate, of the second matrix layer corresponding to the sensing area, wherein the second conductive layer is accommodated in the second groove.

8. The transparent conductive film according to claim 7, wherein, the second electrode trace is embedded in a surface, which is away from the transparent substrate, of the second matrix layer corresponding to the border area; or
the second electrode trace is directly disposed on the surface, which is away from the transparent substrate, of the second matrix layer corresponding to the border area.

9. The transparent conductive film according to claim 7, wherein, a material of the transparent substrate is a thermoplastic material, the thermoplastic material is polycarbonate or polymethylmethacrylate;
a material of the first matrix layer is UV adhesive, embossed plastic or polycarbonate;
a material of the second matrix layer is UV adhesive, embossed plastic or polycarbonate.

10. The transparent conductive film according to claim 1, wherein, the first electrode trace is grid-shaped or strip-shaped, the grid-shaped first electrode trace comprises the first conductive leads intercrossing each other, the strip-shaped first electrode trace has a minimal width of 10 μm~200 μm, and a height of 5 μm~20 μm;
the second electrode trace is grid-shaped or strip-shaped, the grid-shaped second electrode trace comprises the second conductive leads intercrossing each other, the strip-shaped second electrode trace has a minimal width of 10 μm~200 μm, and a height of 5 μm~20 μm.

11. The transparent conductive film according to claim 1, wherein, the conduction line is grid-shaped or strip-shaped, the grid-shaped conduction line is formed by intercrossing conduction wires.

12. The transparent conductive film according to claim 1, wherein, a material of the first conductive layer is a conductive metal, the conductive metal is silver or copper;
a material of the second conductive layer is a conductive metal, the conductive metal is silver or copper.

13. The transparent conductive film according to claim 1, further comprising: a transparent protective layer, wherein the transparent protective layer covers at least a part of the transparent substrate, the first conductive layer, the second conductive layer, the first electrode trace, the second electrode trace and the conduction line.

14. The transparent conductive film according to claim 1, wherein a visible light transmittance of the transparent conductive film is not less than 86%.

* * * * *